(12) United States Patent
Yu et al.

(10) Patent No.: US 7,482,257 B2
(45) Date of Patent: Jan. 27, 2009

(54) METHOD FOR FORMING METAL CONTACT IN SEMICONDUCTOR DEVICE

(75) Inventors: Jae-Seon Yu, Kyoungki-do (KR); Jong-Kuk Kim, Kyoungki-do (KR)

(73) Assignee: Hynix Semiconductor, Inc., Kyoungki-Do (KR)

( * ) Notice: Subject to any disclaimer, the term of this patent is extended or adjusted under 35 U.S.C. 154(b) by 405 days.

(21) Appl. No.: 11/479,287

(22) Filed: Jun. 29, 2006

(65) Prior Publication Data
US 2007/0148858 A1    Jun. 28, 2007

(30) Foreign Application Priority Data
Dec. 28, 2005    (KR) ...................... 10-2005-0131798

(51) Int. Cl.
*H01L 21/8242* (2006.01)
*H01L 21/44* (2006.01)
(52) U.S. Cl. .................. 438/597; 438/238; 438/256
(58) Field of Classification Search .................. 438/238, 438/253, 256, 597
See application file for complete search history.

(56) References Cited

U.S. PATENT DOCUMENTS
6,350,649 B1 *   2/2002  Jeong et al. ................. 438/256
6,756,262 B1 *   6/2004  Nakamura et al. .......... 438/240

FOREIGN PATENT DOCUMENTS
KR   10-2001-0004798       1/2001
KR   10-2005-0052635       6/2005

* cited by examiner

*Primary Examiner*—M. Wilczewski
*Assistant Examiner*—Pamela E Perkins
(74) *Attorney, Agent, or Firm*—Blakely, Sokoloff, Taylor & Zafman LLP

(57) ABSTRACT

A method for forming a metal contact in a semiconductor device includes forming bit lines over a substrate defined into a cell region and a peripheral region, forming a first interlayer dielectric (ILD) layer over the bit lines, forming a first etch stop layer over the first ILD layer, forming a capacitor in the cell region, forming a second etch stop layer over the substrate after the capacitor is formed, forming a second ILD layer over the second etch stop layer, performing a first etching process to etch portions of the second ILD layer and the second etch stop layer to thereby form first metal contact holes exposing the first etch stop layer, and performing a second etching process to etch portions of the first etch stop layer and the first ILD layer to thereby form second metal contact holes exposing the bit lines.

22 Claims, 6 Drawing Sheets

METHOD FOR FORMING METAL CONTACT IN SEMICONDUCTOR DEVICE

FIELD OF THE INVENTION

The present invention relates to a method for fabricating a semiconductor device, and more particularly, to a method for forming a metal contact in a semiconductor device.

DESCRIPTION OF RELATED ARTS

As the size of a metal pattern has decreased and the thickness of an inter-layer dielectric layer to be etched has increased in a formation process of a metal contact in a semiconductor device, a misalignment between the metal contact (M1C) and the bit lines has been frequently occurring. Herein, the metal contact connects the metal pattern, a capacitor upper electrode, and bit lines. This results in the metal contact to form adjacent to the bit lines. Herein, the inter-layer dielectric layer is formed between the metal contact and the bit lines. Thus, the inter-layer dielectric layer under the bit lines becomes etched, resulting in a failure to open a contact hole.

In order to avoid the failure to open a contact hole, a sufficient level of over etching process should be performed, such that, an etch ratio difference between different locations of a wafer and between different sizes of contacts can be reduced. Also, as the size of the metal pattern has decreased, the thickness of the inter-layer dielectric layer has increased, and consequently, a quantity of over etching has been generally required to be increased.

When the misalignment between the metal contact and the bit lines occurs, the metal contact may contact an underlying gate or a substrate, resulting in a defect affecting the functions of the device.

FIGS. 1A and 1B are cross-sectional views illustrating a typical method for forming a metal contact in a semiconductor device.

Referring to FIG. 1A, a substrate 11 is defined into a cell region and a peripheral region, and a gate pattern G is formed over the substrate 11. The gate pattern G includes a gate insulation layer 12, a gate conductive layer 13, and a gate hard mask 14. Although a plurality of the gate patterns G are formed in both the cell region and the peripheral region, only one gate pattern G is illustrated in the peripheral region.

A first inter-layer dielectric (ILD) layer 15 is formed over the substrate 11 and the gate pattern G, and then, a landing contact plug (LPC) process is performed onto the cell region. The resultant LPCs are not illustrated.

A second ILD layer 16 is formed over the first ILD layer 15, and bit lines BL are formed over the second ILD layer 16. Each of the bit lines BL includes a bit line tungsten layer 17 and a bit line hard mask 18. Although the bit lines BL are formed in both the cell region and the peripheral region, the bit lines BL are illustrated in the peripheral region only.

A third ILD layer 19 is formed over the above resulting substrate structure. The third ILD layer 19 is selectively etched to form a storage node contact hole 100, and then, a plug material fills the storage node contact hole 100 to form a storage node contact plug 20.

A capacitor CAP is formed over the storage node contact plug 20. The capacitor CAP includes a storage node 22, a dielectric layer 23, and a plate electrode 24 formed in sequential order. At this time, an etch stop layer 21 remains over a predetermined portion of the third ILD layer 19.

Particularly, the etch stop layer 21 is formed under a storage node oxide layer (not shown), which provides an opening (not shown) for forming a cylinder type capacitor, and is used as an etch stop layer when forming the opening. The storage node 22 is formed over the opening, and the storage node oxide layer is removed after the storage node 22 is isolated.

A fourth ILD layer 25 is formed over the above substrate structure. A metal contact process is performed to form metal contact holes 26 opening portions of the substrate structure above the bit lines BL in the peripheral region.

According to the typical metal line formation method, an etching process is generally performed onto the plate electrode 24 and the dielectric layer 23 for an electrical isolation between adjacent capacitors after forming the plate electrode 24. During this etching process, a certain portion of the underlying etch stop layer 21 is lost, and thus, a thickness of the etch stop layer 21 in the peripheral region decreases. Consequently, when performing a first etching process for forming the metal contact, a sufficient level of over etching process may not be performed because the first etching is less likely to stop at the underlying etch stop layer 21 (refer to 'X').

Referring to FIG. 1B, as reference letter 'A' illustrates, when a misalignment occurs between the metal contact and the bit line BL, the metal contact becomes connected to the gate pattern G or the substrate 11 due to the thinly remaining etch stop layer 21. Hence, defects affecting the functions of the device, such as short circuits, may occur.

SUMMARY OF THE INVENTION

It is, therefore, an object of the present invention to provide a method for forming a metal contact in a semiconductor device, wherein the method can avoid an opening of a bottom conductive pattern caused by an unintended over etching during a metal contact process.

In accordance with an aspect of the present invention, there is provided a method for forming a metal contact in a semiconductor device, including: forming bit lines over a substrate defined into a cell region and a peripheral region; forming a first inter-layer dielectric (ILD) layer over the bit lines; forming a first etch stop layer over the first ILD layer; forming a capacitor in the cell region; forming a second etch stop layer over the substrate after the capacitor is formed; forming a second ILD layer over the second etch stop layer; performing a first etching process to etch predetermined portions of the second ILD layer and the second etch stop layer to thereby form first metal contact holes exposing the first etch stop layer; and performing a second etching process to etch predetermined portions of the first etch stop layer and the first ILD layer to thereby form second metal contact holes exposing the bit lines.

In accordance with another aspect of the present invention, there is provided a method for forming a metal contact in a semiconductor device, including: preparing a substrate defined into a cell region and a peripheral region; forming bit lines in the peripheral region; forming a first ILD layer covering the bit lines; forming a storage node contact plug penetrating the first ILD layer in the cell region; forming a first etch stop layer over the first ILD layer and the storage node contact plug; forming a capacitor contacting the storage node contact plug in the cell region; forming a second etch stop layer over a resulting structure obtained after forming the capacitor; forming a second ILD layer over the second etch stop layer; performing a first etching process to etch predetermined portions of the second ILD layer and the second etch stop layer to thereby form first metal contact holes exposing the first etch stop layer; and performing a second etching process to etch predetermined portions of the first etch stop layer and the first ILD layer to thereby form second metal contact holes exposing the bit lines.

BRIEF DESCRIPTION OF THE DRAWINGS

The above and other objects and features of the present invention will become better understood with respect to the following description of the exemplary embodiments given in conjunction with the accompanying drawings, in which.

DETAILED DESCRIPTION OF THE INVENTION

A method for forming a metal contact in a semiconductor device in accordance with exemplary embodiments of the present invention will be described in detail with reference to the accompanying drawings.

FIGS. 2A to 2D are cross-sectional views illustrating a method for forming a metal contact in a semiconductor device in accordance with a specific embodiment of the present invention.

Figure 1A:
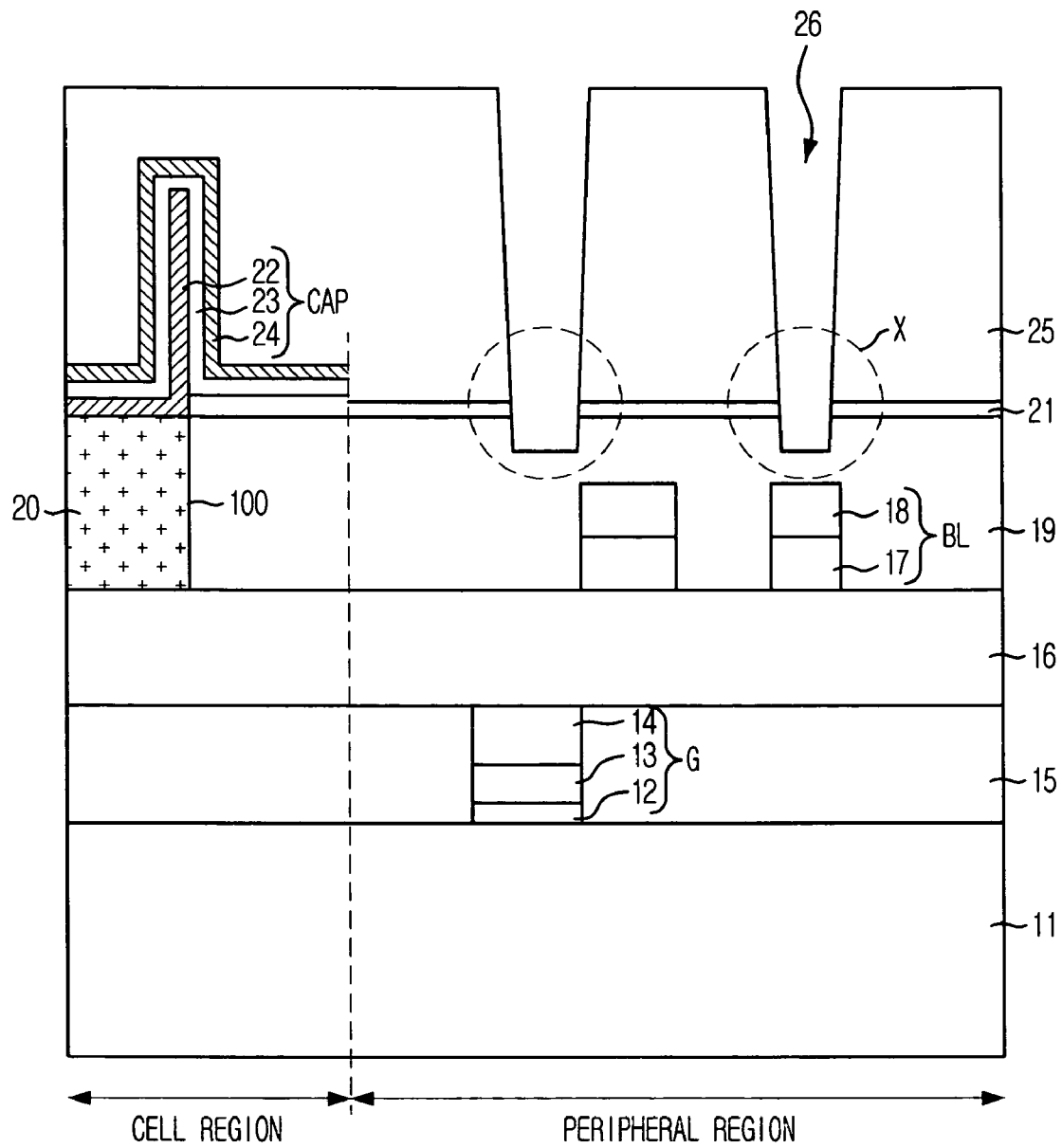
FIGS. 1A and 1B are cross-sectional views illustrating a typical method for forming a metal contact in a semiconductor device.
Figure 1B:
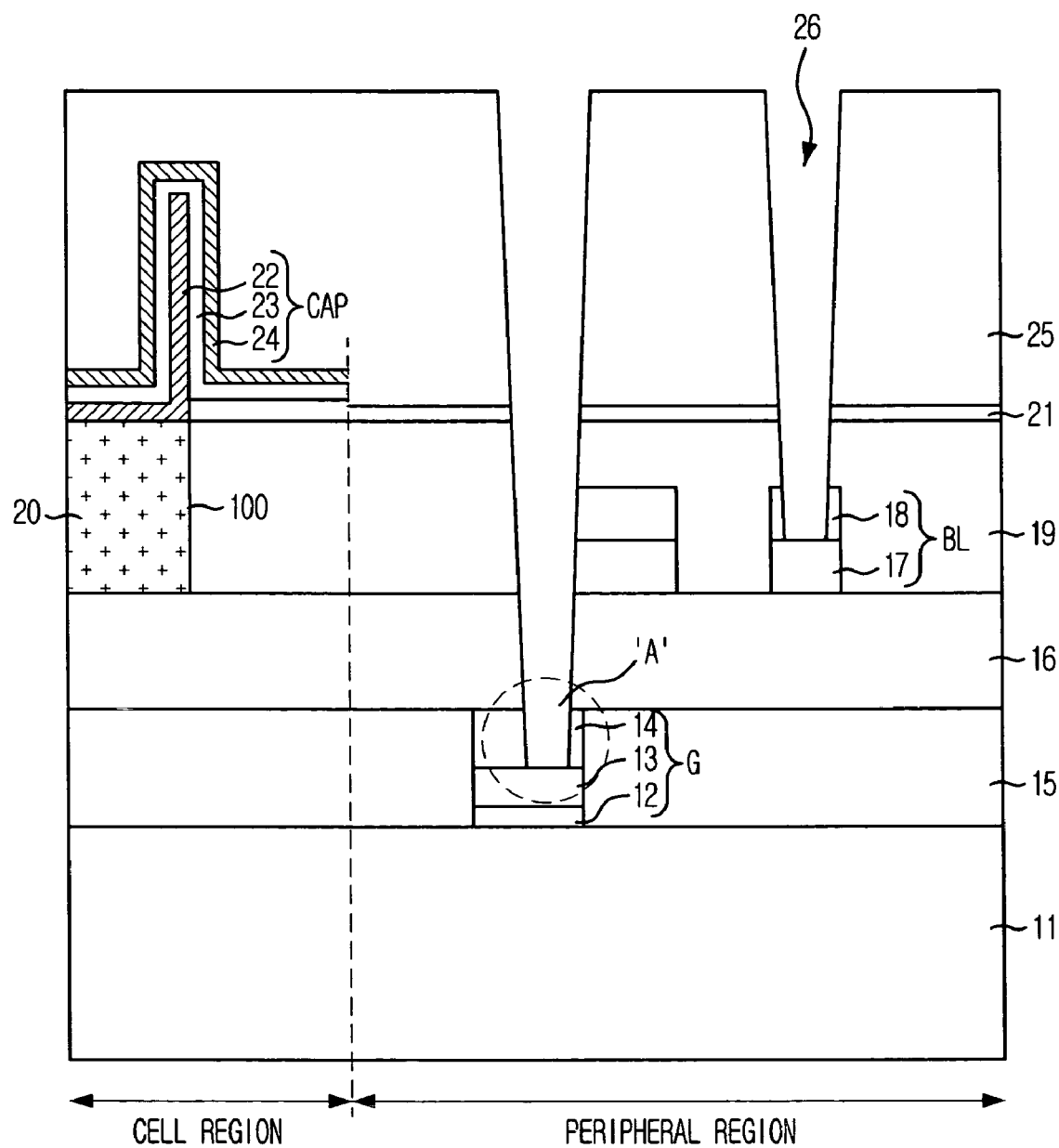
Figure 2A:
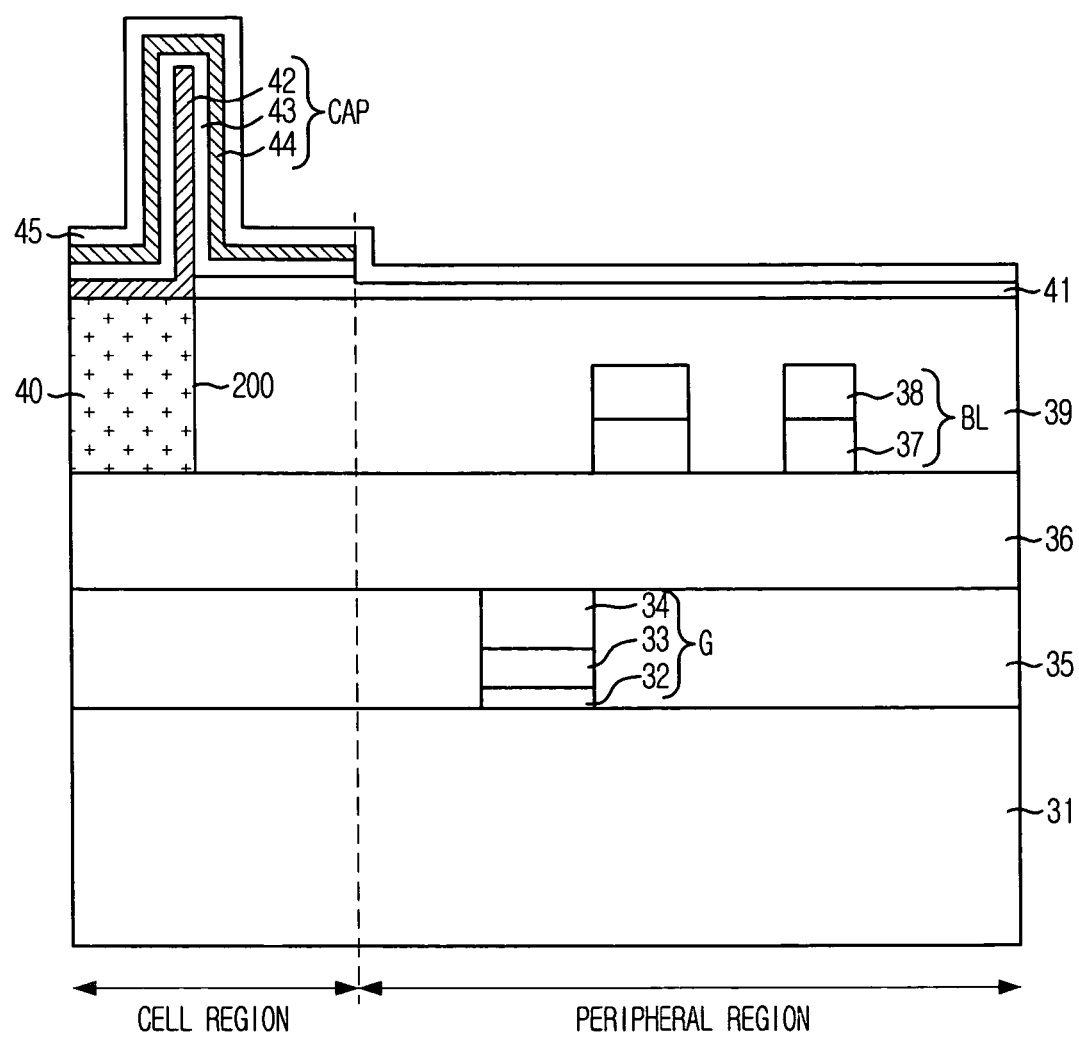
FIGS. 2A to 2D are cross-sectional views illustrating a method for forming a metal contact in a semiconductor device in accordance with a specific embodiment of the present invention.

Referring to FIG. 2A, a plurality of gates G are formed over a substrate 31. The substrate 31 is defined into a cell region and a peripheral region. The gates G are patterned structures including a gate insulation layer 32, a gate conductive layer 33, and a gate hard mask 34. Although a plurality of the gates G are formed in both cell region and the peripheral region, only one of the gates G is illustrated in the peripheral region.

A first inter-layer dielectric (ILD) 35 is formed over the above resulting substrate structure, and then, a planarization process is performed until the gate hard mask layer 34 of the gate G is exposed. A landing plug contact (LPC) process is performed in the cell region to form landing plugs between gates G. The resultant LPCs are not shown.

A second ILD layer 36 is formed over the first ILD layer 35, and bit lines BL are formed over the second ILD layer 36. Each of the bit lines BL includes a bit line tungsten layer 37 and a bit line hard mask 38. Although the bit lines BL are formed in both the cell region and the peripheral region, the bit lines BL are illustrated in the peripheral region only.

A third ILD layer 39 is formed over the above resulting substrate structure. The third ILD layer 39 is selectively etched to form a storage node contact hole 200, and then, a conductive plug material fills the storage node contact hole 200 to form a storage node contact plug 40.

A first etch stop layer 41 and a storage node oxide layer (not shown) are sequentially formed over the above resulting substrate structure. The storage node oxide layer and the first etch stop layer 41 are selectively etched in sequential order to form an opening (not shown) which exposes the storage node contact plug 40. The first etch stop layer 41 includes nitride.

A storage node 42 is formed over the opening, and a storage node isolation process is performed. A wet dip out process is performed to remove the storage node oxide layer after the storage node 42 is isolated. A dielectric layer 43 and a plate electrode 44 are sequentially formed over the storage node 42, and then, an etch process for electrically isolating adjacent capacitors is performed to form a capacitor CAP. The etch process employs the first etch stop layer 41 as a barrier layer, and consequently, a certain portion of the first etch stop layer 41 is etched, resulting in a reduced thickness of the first etch stop layer 41.

A second etch stop layer 45 is formed over the above resulting substrate structure to compensate the loss of the first etch stop layer 41 occurred during the etch process for electrically isolating adjacent capacitors. The second etch stop layer 45 includes a material substantially the same as the first etch stop layer 41, i.e., a nitride-based material. The second etch stop layer 45 can be formed by employing a nitride-based silicon-rich silicon oxynitride (SiON) layer having a thickness ranging from approximately 300 Å to approximately 1,500 Å.

Figure 2B:
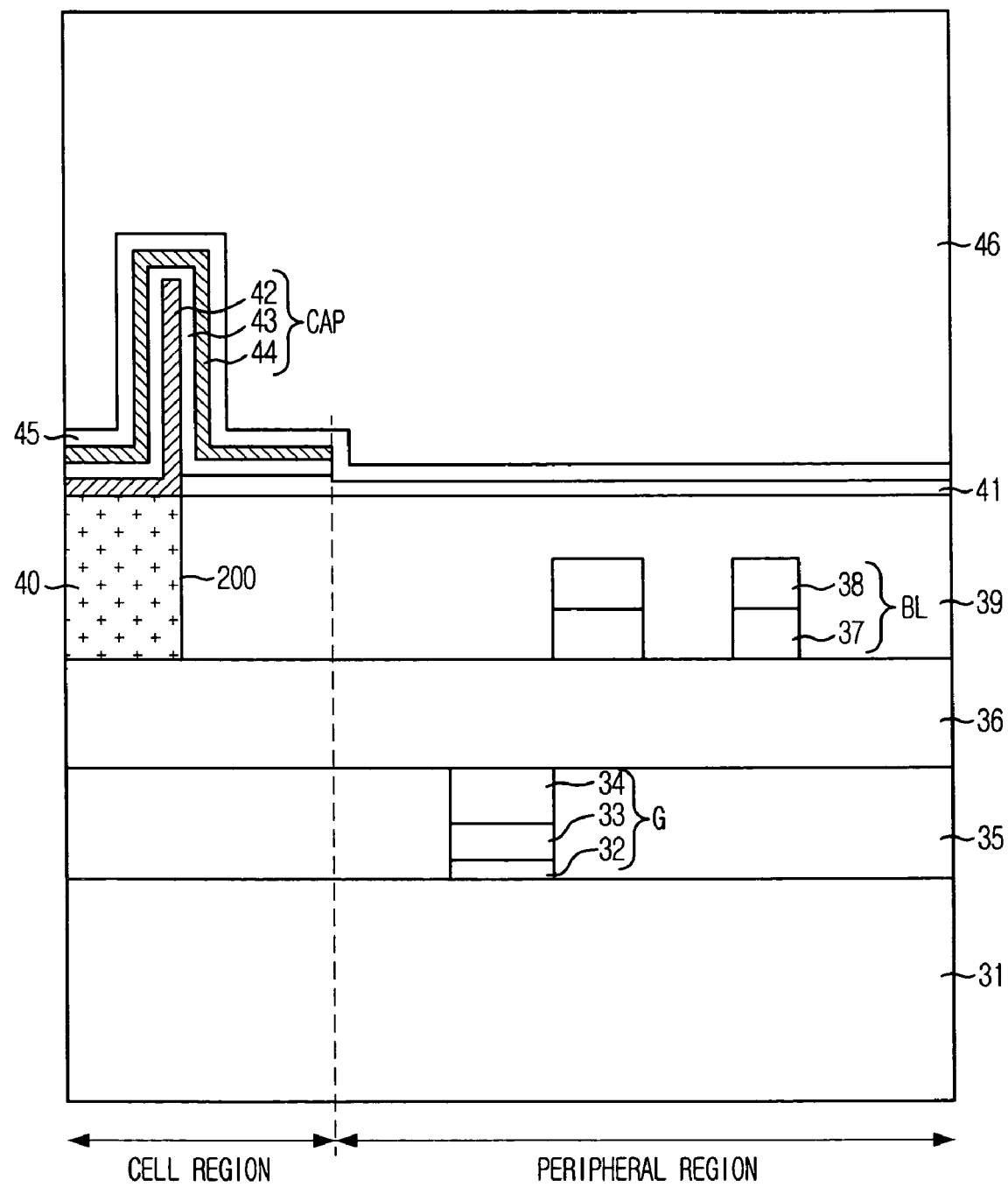

As shown in FIG. 2B, a fourth ILD layer 46 is formed over the second etch stop layer 45. The fourth ILD layer 46 is formed to a larger thickness than the third ILD layer 39 due to an increased height of the capacitor CAP formed in the cell region.

Figure 2C:
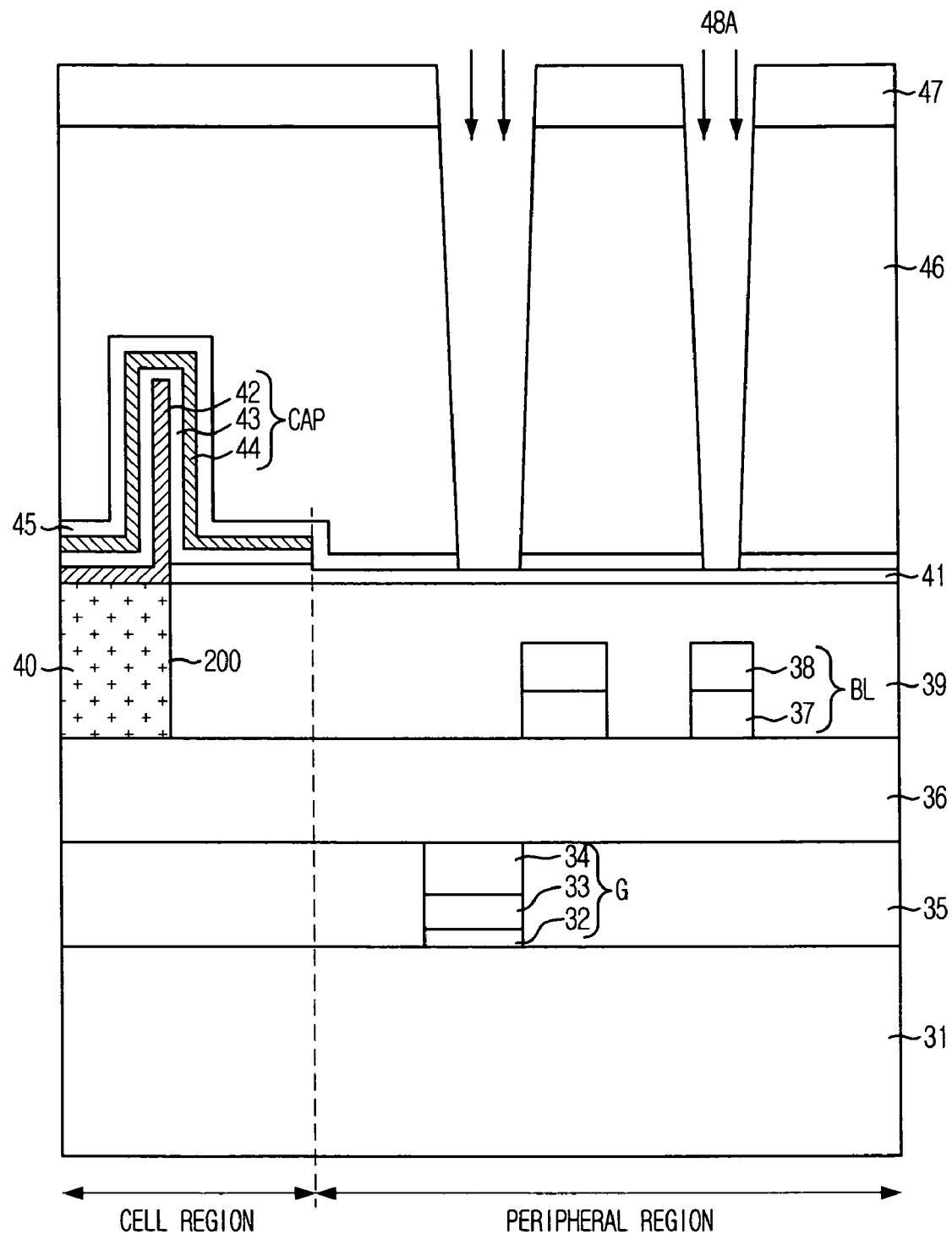

Referring to FIG. 2C, a contact mask 47 is formed over predetermined portions of the fourth ILD layer 46. The contact mask 47 includes photoresist. Since a metal contact process is performed only in the peripheral region, the contact mask 47 covers the cell region.

A first etching process 48A using the contact mask 47 is performed to etch predetermined portions of the fourth ILD layer 46 and the second etch stop layer 45. The first etching process 48A uses the first etch stop layer 41 as an etch stop layer, and therefore, the first etching process 48A is performed until the predetermined portions of the second etch stop layer 45 are etched. The first etching process 48A is generally performed to a certain level, such that the first etch stop layer 41 is not exposed during the first etching process 48A.

The first etching process 48A is performed by employing an etch gas having a high etch selectivity of oxide with respect to nitride. The first etching process 48A continues up to the first etch stop layer 41, but not exposing the first etch stop layer 41, using the etch gas with a low level of polymer generation to perform the over etching with a small etch slop profile. The etch gas includes a main etch gas selected from a group consisting of a $C_xF_y$-based gas, a $C_xH_yF_z$-based gas, and nitrogen trifluoride ($NF_3$) gas. The $C_xF_y$-based gas includes $C_2F_6$ and $CF_4$. The $C_xH_yF_z$-based gas includes $CHF_3$.

Figure 2D:
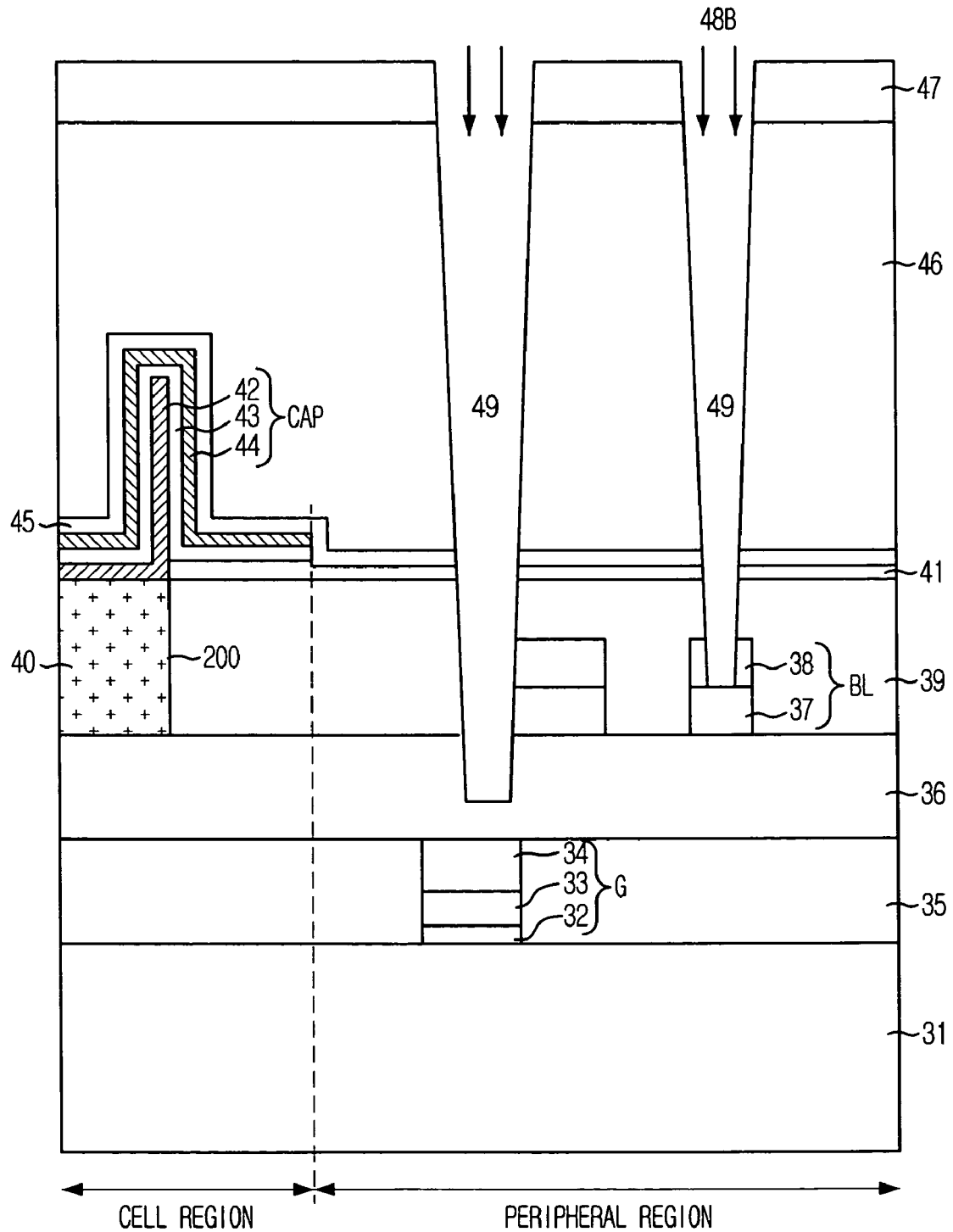

Referring to FIG. 2D, a second etching process 48B is performed to sequentially etch predetermined portions of the first etch stop layer 41, the third ILD layer 39, and the bit line hard mask 38. As a result, intended metal contact holes 49 are formed. The second etching process 48B uses an etch gas having a high etch selectivity of oxide with respect to nitride, and a high level of polymer generation. The etch gas includes a main etch gas selected from a group consisting of $C_3F_8$, $C_4F_8$, $C_4F_6$, and $C_5F_8$.

The second etching process 48B has a much smaller depth subjected to etching than the first etching process 48A. Thus, the metal contact holes 49 can be controlled in a manner, such that the metal contact holes 49 do not reach the gates G by performing a lower level of over etching when the metal contact holes 49 and the bit lines BL are misaligned. After the metal contact holes 49 are formed, the contact mask 47 is removed.

Consistent with specific embodiments, the second etch stop layer is formed to compensate the reduced thickness of the first etch stop layer remaining after the etching of the plate electrode of the capacitor. The second etch stop layer enlarges the total thickness of the nitride-based layers, and thus, allows the first etching process to stop at the first etch stop layer with a sufficient level of over etching. The second etching process with the low level of over etching is performed to form the metal contacts, exposing upper portions of the underlying bit lines.

That is, the first etching process is performed with a sufficient level of over etching using the nitride layer formed under the capacitor as the etch stop layer. The nitride layer is used as the etch stop layer during the etching of the capacitor, and the first etching process includes using the high etch selectivity with respect to nitride. Thus, the metal contact holes stop at the nitride layer below the capacitor. The nitride layer, the oxide layer, and the bit line hard mask nitride layer below the capacitor are etched with the high etch selectivity to nitride. Thus, even if losses occur in the nitride layer due to the over etching, occurrences of short circuits between devices can be reduced because of the etch stop nitride layer at the bottom.

An etch ratio difference between different locations of a wafer and between different sizes of metal contacts can be reduced by employing the sufficient level of over etching during the first etching process. Also, the metal contacts can be prevented from reaching the gates even when a misalignment between the metal contact and the bit line occur, because the second etching process includes a low level of over etching.

In accordance with the specific embodiment of the present invention, defects affecting the functions of a device can be reduced by decreasing the chances of the metal contacts contacting the gates or the substrate, which may result in short circuits while forming the metal contacts in a cylinder type capacitor. Furthermore, the yield rate of production of the device can be improved.

The present application contains subject matter related to the Korean patent application No. KR 2005-0131798, filed in the Korean Patent Office on Dec. 28, 2005, the entire contents of which being incorporated herein by reference.

While the present invention has been described with respect to certain specific embodiments, it will be apparent to those skilled in the art that various changes and modifications may be made without departing from the spirit and scope of the invention as defined in the following claims.

What is claimed is:

1. A method for forming a metal contact in a semiconductor device, the method comprising:
    forming bit lines over a substrate defined into a cell region and a peripheral region;
    forming a first inter-layer dielectric (ILD) layer over the bit lines;
    forming a first etch stop layer over the first ILD layer;
    forming a capacitor in the cell region;
    forming a second etch stop layer over the substrate after the capacitor is formed;
    forming a second ILD layer over the second etch stop layer;
    performing a first etching process to etch predetermined portions of the second ILD layer and the second etch stop layer to thereby form first metal contact holes exposing the first etch stop layer; and
    performing a second etching process to etch predetermined portions of the first etch stop layer and the first ILD layer to thereby form second metal contact holes exposing the bit lines.

2. The method of claim 1, wherein the first etch stop layer includes a material substantially the same as the second etch stop layer.

3. The method of claim 2, wherein the second etch stop layer includes a material having a high etch selectivity to the second ILD layer.

4. The method of claim 3, wherein the second etch stop layer includes silicon oxynitride (SiON).

5. The method of claim 2, wherein the performing of the first etching process to form the first metal contact holes includes using an etch gas which generates a lower level of polymers than the second etching process.

6. The method of claim 5, wherein the performing of the first etching process to form the first metal contact holes includes using a main etch gas selected from a group consisting of a $C_xF_y$-based gas, a $C_xH_yF_z$-based gas, and nitrogen trifluoride ($NF_3$) gas.

7. The method of claim 6, wherein the $C_x F_y$-based gas includes one of $C_2F_6$ and $CF_4$.

8. The method of claim 6, wherein the $C_xH_yF_z$-based gas includes $CHF_3$.

9. The method of claim 5, wherein the performing of the second etching process to form the second metal contact holes includes using a main etch gas selected from a group consisting of $C_3F_8$, $C_4F_8$, $C_4F_6$, and $C_5F_8$.

10. The method of claim 5, wherein the second ILD layer is formed to a larger thickness than the first ILD layer due to an increased height of the capacitor formed in the cell region.

11. The method of claim 5, wherein a thickness of the first etch stop layer is decreased due to an etching process performed to form the capacitor.

12. A method for forming a metal contact in a semiconductor device, the method comprising:
    preparing a substrate defined into a cell region and a peripheral region;
    forming bit lines in the peripheral region;
    forming a first inter-layer dielectric (ILD) layer covering the bit lines;
    forming a storage node contact plug penetrating the first ILD layer in the cell region;
    forming a first etch stop layer over the first ILD layer and the storage node contact plug;
    forming a capacitor contacting the storage node contact plug in the cell region;
    forming a second etch stop layer over a resulting structure obtained after forming the capacitor;
    forming a second ILD layer over the second etch stop layer;
    performing a first etching process to etch predetermined portions of the second ILD layer and the second etch stop layer to thereby form first metal contact holes exposing the first etch stop layer; and
    performing a second etching process to etch predetermined portions of the first etch stop layer and the first ILD layer to thereby form second metal contact holes exposing the bit lines.

13. The method of claim 12, wherein the first etch stop layer includes a material substantially the same as the second etch stop layer.

14. The method of claim 13, wherein the second etch stop layer includes a material having a high etch selectivity to the second ILD layer.

15. The method of claim 14, wherein the second etch stop layer includes SiON.

16. The method of claim 13, wherein the performing of the first etching process to form the first metal contact holes includes using an etch gas which generates a lower level of polymers than the second etching process.

17. The method of claim 16, wherein the performing of the first etching process to form the first metal contact holes includes using a main etch gas selected from a group consisting of a $C_xF_y$-based gas, a $C_xH_yF_z$-based gas, and $NF_3$ gas.

18. The method of claim 17, wherein the $C_xF_y$-based gas includes one of $C_2F_6$ and $CF_4$.

19. The method of claim 17, wherein the $C_xH_yF_z$-based gas includes $CHF_3$.

20. The method of claim 16, wherein the performing of the second etching process to form the second metal contact holes includes using a main etch gas selected from a group consisting of $C_3F_8$, $C_4F_8$, $C_4F_6$, and $C_5F_8$.

21. The method of claim 16, wherein the second ILD layer is formed to a larger thickness than the first ILD layer due to an increased height of the capacitor formed in the cell region.

22. The method of claim 16, wherein a thickness of the first etch stop layer is decreased due to an etching process performed to form the capacitor.

* * * * *